United States Patent [19]

Shimizu et al.

[11] Patent Number: 5,217,910
[45] Date of Patent: Jun. 8, 1993

[54] METHOD OF FABRICATING SEMICONDUCTOR DEVICE HAVING SIDEWALL SPACERS AND OBLIQUE IMPLANTATION

[75] Inventors: Masahiro Shimizu; Katsuyoshi Mitsui; Yomiyuki Yama; Masatoshi Yasunaga, all of Hyogo, Japan

[73] Assignee: Mitsubishi Denki Kabushiki Kaisha, Tokyo, Japan

[21] Appl. No.: 779,498

[22] Filed: Oct. 24, 1991

[30] Foreign Application Priority Data

Nov. 5, 1990 [JP] Japan .................. 2-300343

[51] Int. Cl.⁵ .......................... H01L 21/265
[52] U.S. Cl. ........................ 437/35; 437/30; 437/44; 437/149
[58] Field of Search ............. 437/27, 28, 29, 30, 437/35, 36, 44, 80, 149, 150, 153, 154, 157, 953, 954

[56] References Cited

U.S. PATENT DOCUMENTS

| | | | |
|---|---|---|---|
| 4,771,012 | 9/1988 | Yabu et al. | 437/35 |
| 4,843,023 | 6/1989 | Chiu et al. | 437/30 |
| 4,891,326 | 1/1990 | Koyanagi | 437/44 |
| 4,978,626 | 12/1990 | Poon et al. | 437/44 |

FOREIGN PATENT DOCUMENTS

| | | |
|---|---|---|
| 61-139070 | 6/1986 | Japan . |
| 0113474 | 5/1987 | Japan .................. 437/35 |
| 1-212471 | 8/1989 | Japan . |
| 0065255 | 3/1990 | Japan .................. 437/35 |
| 0153538 | 6/1990 | Japan .................. 437/30 |
| 0156642 | 6/1990 | Japan .................. 437/35 |

OTHER PUBLICATIONS

"Fabrication of High-Performance LDDFET's with Oxide Sidewall-Spacer Technology", IEEE Transactions on Electron Devices, vol. ED-29, No. 4, Apr., 1982, by Paul J. Tsang et al, pp. 590-596.

*Primary Examiner*—Brian E. Hearn
*Assistant Examiner*—C. Chaudhari
*Attorney, Agent, or Firm*—Lowe, Price, LeBlanc & Becker

[57] ABSTRACT

First, a low-concentration impurity layer is formed by obliquely implanting an n-type impurity at a prescribed angle with respect to the surface of a p-type semiconductor substrate, using a gate electrode formed on the semiconductor substrate as a mask. Thereafter a sidewall spacer is formed on the sidewall of the gate electrode, and then a medium-concentration impurity layer is formed by obliquely implanting an n-type impurity to the surface of the semiconductor substrate. Thereafter a high-concentration impurity layer is formed by substantially perpendicularly implanting an n-type impurity with respect to the surface of the semiconductor substrate. According to this method, the low-concentration impurity layer in source and drain regions having triple diffusion structures can be accurately overlapped with the gate electrode, with no requirement for heat treatment for thermal diffusion.

20 Claims, 16 Drawing Sheets

METHOD OF FABRICATING SEMICONDUCTOR DEVICE HAVING SIDEWALL SPACERS AND OBLIQUE IMPLANTATION

BACKGROUND OF THE INVENTION

1. Field of the Invention

The present invention relates to a method of fabricating a semiconductor device including MOS (metal oxide semiconductor) field effect transistors (hereinafter referred to as MOSFETs), and more particularly, it relates to a method of fabricating a semiconductor device, whose source and drain regions have triple diffusion structures, for attaining improvements of characteristics.

2. Description of the Background Art

FIG. 1 shows an LDD (lightly doped drain) type MOSFET, which has been announced by Tsang et al. as a structure for relieving an electric field in a drain part of a short channel transistor (see IEEE Transaction Electron Devices, Vol., ED-29, 1982, pp. 590–596).

An n-channel MOSFET having such an LDD structure as shown in FIG. 1 is hereinafter referred to as "first prior art". Referring to FIG. 1, the n-channel MOSFET comprises a p-type semiconductor substrate 1 and a gate electrode 3 of polysilicon formed thereon through a gate insulating film 2. Sidewall spacers 4 of oxide films are formed along sidewalls of the gate electrode 3. At the surface of the semiconductor substrate 1, a source region 5 and a drain region 6 are formed on both sides of the gate electrode 3. The source region 5 is formed by a high-concentration n-type impurity diffusion layer 5a of $10^{18}$/cm$^3$ to $10^{20}$/cm$^3$ and a low-concentration n-type impurity diffusion layer 5b of $10^{17}$/cm$^3$ to $10^{18}$/cm$^3$, while the drain region 6 is formed by a high-concentration n-type impurity diffusion layer 6a and a low-concentration n-type impurity diffusion layer 6b. Parts of the low-concentration n-type impurity diffusion layers 5b and 6b extend into a region which is located immediately under the gate electrode 3 by several hundred Å beyond the ends thereof.

The function of the LDD structure according to the first prior art is now described with reference to FIG. 1. The source region 5 and the semiconductor substrate 1 of the n-type MOSFET are set at potentials of 0 V, for example, while the drain region 6 is supplied with a source voltage of 5 V, for example. Therefore, the p-n junction between the n-type impurity diffusion layers 6a and 6b of the drain region 6 and the p-type semiconductor substrate 1 is reverse-biased, to generate a high electric field.

Such a drain field is relieved as the width of a depletion layer is increased. The width $\omega$ of such a depletion layer of the p-n junction is as follows:

$$\omega = \sqrt{\frac{2\epsilon_s}{q} \frac{(N_A + N_D)}{N_A \cdot N_D}}$$

where $N_A$ represents acceptor concentration, $N_D$ represents donor concentration, $\epsilon_s$ represents the dielectric constant of the semiconductor, and o represents the amount of charges. When the n-type impurity concentration is extremely higher than the p-type impurity concentration, i.e., $N_D > N_A$, the width $\omega$ of the depletion layer is as follows:

$$\omega = \sqrt{(2\epsilon_s/qN_A)}$$

When the n-type impurity concentration is equal to the impurity concentration of the p-type semiconductor substrate, i.e., $N_A = N_D$, the width $\omega$ of the depletion layer is as follows:

$$\omega = \sqrt{(4\epsilon_s/qN_A)}$$

Thus, it is understood that the width $\omega$ of the depletion layer is increased as the donor concentration $N_D$ is reduced, to relieve the field strength.

On the basis of the aforementioned concept, the LDD-MOSFET according to the first prior art as shown in FIG. 1 is provided with the low-concentration n-type impurity diffusion layers 5b and 6b along the p-n junction parts between the semiconductor substrate 1 and the high-concentration n-type impurity diffusion layers 5a and 6a, to relieve the field strength.

The working condition of the LDD-MOSFET is now described with reference to FIGS. 2A and 2B. The operation of such a transistor is divided into that in a pentode region (FIG. 2A) where a drain voltage $V_D$ is greater than a gate voltage $V_G$ and that in a triode region (FIG. 2B) where the gate voltage $V_G$ is extremely greater than the drain voltage $V_D$. In the pentode region shown in FIG. 2A, a high-resistance depletion layer 8 is formed between an inversion layer 7 and the drain region 6. In this case, driving ability of the transistor is reduced by the resistance, which is parasitic resistance, of the low-concentration n-type impurity diffusion layer 5b of the source region 5, that of the depletion layer 8 along the drain region 6, and that of the low-concentration n-type impurity diffusion layer 6b of the drain region 6, in addition to the resistance of a channel formed by the inversion layer 7. In the triode region shown in FIG. 2B, on the other hand, the driving ability of the transistor is reduced by the resistance, which is parasitic resistance, of the n-type impurity diffusion layer 5a of the source region 5, and that of the n-type impurity diffusion layer 6a of the drain region 6.

In the drain structure of the LDD-MOSFET according to the first prior art, further, hot carriers having higher energy than that in a thermal equilibrium state are produced on the surface of the low-concentration n-type impurity diffusion layer 6b. Such hot carriers are injected into the sidewall spacer 4 which is formed along the sidewall of the gate electrode 3, to deplete the surface of the n-type impurity diffusion layer 6b of the drain region 6 and increase the resistance of this region. Thus, the driving ability of the MOSFET is further deteriorated.

FIG. 3 shows another conventional LDD-MOSFET (hereinafter referred to as "second prior art") disclosed in Japanese Patent Laying-Open No. 1-212471, for example, which has been proposed in order to solve the aforementioned problem of the first prior art. Referring to FIG. 3, low-concentration n-type impurity diffusion layers 5b and 6b of source and drain regions 5 and 6 are overlapped with a gate electrode 3, while ends of high-concentration n-type impurity diffusion layers 5a and 6a are aligned with those of the gate electrode 3.

In the structure of the LDD-MOSFET according to the second prior art, the low-concentration n-type impurity diffusion layers 5b and 6b are completely covered with the gate electrode 3. Therefore, carrier concentration on the surfaces of the low-concentration impurity diffusion layers 5b and 6b is increased by a voltage which is applied to the gate electrode 3, to suppress increase of the regulated resistance in the source region 5. Further, a region of the drain region 6 generating a high electric field is located not immediately under the sidewall spacer 4 but immediately under the gate electrode 3, whereby no hot carriers are injected into the sidewall spacer 4. Consequently, the low-concentration impurity diffusion layer 6b is prevented from depletion of its surface.

FIGS. 4A and 4B show carrier production rate distributions in the first prior art and the second prior art, for clearly illustrating difference between hot carrier production states thereof. FIGS. 5A and 5B show transistor characteristics of the first prior art and the second prior art respectively.

When the low-concentration n-type diffusion layers 5b and 6b of the second prior art are prepared from phosphorus, in particular, the regions thereof are spread by heat treatment since phosphorus has a large diffusion coefficient. If the width of the gate electrode 3 is reduced as the result of high integration, therefore, it is impossible to attain sufficient lengths of the low-concentration n-type impurity diffusion layers 5b and 6b in order to ensure an effective channel length, and a sufficient field strength relieving effect cannot be attained since the high-concentration n-type impurity diffusion layers 5a and 6a reach ends of the gate electrode 3. If the high-concentration n-type impurity diffusion layers 5a and 6a are reduced in concentration in order to avoid this, the current driving characteristic of the transistor is problematically deteriorated. This problem is unavoidable in an LDD structure employing double diffusion layers.

FIG. 6 shows still another conventional LDD-MOSFET (hereinafter referred to as "third prior art") having triple diffusion structures disclosed in Japanese Patent Laying-Open No. 61-139070, for example, which has been proposed in order to solve the aforementioned problem of the second prior art.

Referring to FIG. 6, the MOSFET according to the third prior art is formed on an active region of a p-type semiconductor substrate 11, which is isolated by isolating regions 12. This MOSFET has a gate electrode 14, which is formed on the semiconductor substrate 11 with a gate insulating film 13 interposed therebetween, and source and drain regions 15 and 16, which are formed on the surface of the semiconductor substrate 11. Sidewall spacers 17 are formed on both side portions of the gate electrode 14. The surfaces of the gate electrode 14, the sidewall spacers 17 and the isolation regions 12 are covered with interlayer isolation films 18, while the source and drain regions 16 communicate with aluminum wires 20 through contact holes 19 which are formed in prescribed positions of the interlayer isolation films 18. The source and drain regions 15 and 16 are formed by low-concentration n-type impurity layers 15c and 16c which are overlapped with the gate electrode 13, medium-concentration n-type impurity layers 15b and 16b which are located immediately under the sidewall spacers 17, and high-concentration n-type impurity layers 15a and 16a which are adjacent thereto.

FIGS. 7A to 7E show a method of fabricating the MOSFET according to the third prior art. First, phosphorus ions are implanted through a mask of the gate electrode 14 from a direction which is substantially perpendicular to the surface of the semiconductor substrate 11, to form the low-concentration n-type impurity layers 15c and 16c (FIG. 7A). In this case, in order to prevent so-called channeling, the direction of ion-implantation should be inclined about 7° from the normal direction.

Then, the sidewall spacers 17 are formed on both sidewalls of the gate electrode 14 (FIG. 7B), and arsenic ions are perpendicularly implanted with respect to the surface of the semiconductor substrate 11 through masks of the sidewall spacers 17, to form the medium-concentration n-type impurity layers 15b and 16b (FIG. 7C). Then, heat treatment is performed to diffuse the low-concentration n-type impurity layers 15c and 16c and the medium-concentration n-type impurity layers 15b and 16b so that the respective n-type impurity layers move toward the center of the channel region, thereby attaining the state shown in FIG. 7D. Thereafter arsenic ions are further implanted substantially perpendicularly to the semiconductor substrate 11 through masks of the gate electrode 14 and the sidewall spacers 17, to form the high-concentration n-type impurity layers 15a and 16a (FIG. 7E). The direction should be inclined about 7° C. from the normal direction also in this case for preventing channeling.

The problems of the first prior art and the second prior art are solved so far as it is possible to overlap the low-concentration n-type impurity layers 15c and 16c with the gate electrode 14 and to form the medium-concentration n-type impurity layers 15b and 16b immediately under the sidewall spacers 17 in high accuracy in the LDD-MOSFET of the triple diffusion structure according to the third prior art.

In the method shown in FIGS. 7A to 7E in relation to the third prior art, however, the low-concentration n-type impurity layers 15c and 16c are overlapped with the gate electrode 14 and the medium-concentration n-type impurity layers 15b and 16b are formed immediately under the sidewall spacers 17 through thermal diffusion steps. Thus, it is extremely difficult to attain desired impurity concentration distributions in high accuracy.

Particularly in fabrication of a semiconductor memory device such as a CMOS (complementary MOS) device having n-channel and p-channel MOSFETs formed on the same semiconductor substrate, it is impossible to attain required concentration distributions through heat treatment steps with widths of sidewall spacers which are common to the MOSFETs in the fabrication steps according to the third prior art, since impurity ions implanted for forming source and drain regions of the MOSFETs have different diffusion coefficients. Namely, diffusion coefficients of boron ions ($B^+$) and $BF_2$ ions which are employed for forming source and drain regions of the p-channel MOSFET are larger than those of phosphorus ions and arsenic ions which are employed for forming source and drain regions of the n-channel MOSFET, and hence the effective channel length is reduced due to significant progress of diffusion if the sidewall spacers are identical in width to each other. Therefore, sidewall spacers for the p-channel MOSFET must be formed independently of those for the n-channel MOSFET to have larger widths. Thus, the fabrication steps are complicated.

SUMMARY OF THE INVENTION

A first object of the present invention is to provide a method of fabricating a semiconductor device, which can accurately form LDD-MOSFETs having double or triple diffusion structures with no requirement for a thermal diffusion step.

A second object of the present invention is to enable formation of LDD-MOSFETs having double or triple diffusion structures in high accuracy with no requirement for separate formation of sidewall spacers also when p-channel and n-channel MOSFETs are formed on the same substrate.

In the inventive method of fabricating a semiconductor device for attaining the aforementioned first object, a first conductivity type semiconductor substrate is prepared and a gate electrode is formed on this semiconductor substrate through a gate insulating film. Then, this gate electrode is used as a mask to obliquely implant a second conductivity type impurity at a prescribed angle with respect to the surface of the semiconductor substrate, thereby forming low-concentration impurity layers. Thereafter sidewall spacers are formed along sidewalls of the gate electrode, and a second conductivity type impurity is obliquely implanted at a prescribed angle with respect to the surface of the semiconductor substrate through masks of the gate electrode and the sidewall spacers, to form medium-concentration impurity layers. Thereafter a second conductivity type impurity is substantially perpendicularly implanted with respect to the surface of the semiconductor substrate through masks of the gate electrode and the sidewall spacers, to form high-concentration impurity layers.

Among source and drain regions having triple diffusion structures, the low-concentration impurity layers are first formed according to the aforementioned fabrication steps, by obliquely implanting second conductivity type ions at a prescribed angle with respect to the surface of the first conductivity type semiconductor substrate using only the gate electrode as a mask. Thus, it is possible to accurately overlap the low-concentration impurity layers with the gate electrode, with no requirement for heat treatment for thermal diffusion.

After the sidewall spacers are formed, the gate electrode and the sidewall spacers are used as masks to form the medium-concentration impurity layers by obliquely implanting second conductivity type impurity ions at a prescribed angle with respect to the surface of the semiconductor substrate and then to form the high-concentration impurity layers by perpendicularly implanting second conductivity type impurity ions with respect to the surface of the semiconductor substrate. Thus, it is possible to accurately form the medium-concentration impurity layers in desired widths immediately under the sidewall spacers, with no requirement for heat treatment for thermal diffusion.

Alternatively, it is also possible to form desired medium-concentration impurity layers with no requirement for heat treatment for thermal diffusion similarly to the aforementioned steps, by substantially perpendicularly implanting an impurity with respect to the surface of the semiconductor substrate using only the gate electrode as a mask while forming the low-concentration and high-concentration impurity layers through steps similar to the above.

The concept of the present invention can be applied for fabricating double layer LDDMOSFETs as well as triple layer LDDMOSFETs. That is, such effects as mentioned above can be attained also in fabricating double layer LDDMOSFETs, by the steps comprising obliquely implanting a second conductivity type impurity at a prescribed angle with respect to the substrate of the semiconductor substrate using the gate electrode and the sidewall spacers as masks, thereby forming low-concentration impurity layers, and then implanting a second conductivity type impurity substantially perpendicularly with respect to the surface of the semiconductor substrate also using the gate electrode and the sidewall spacers as masks to form high-concentration impurity layers.

The aforementioned second object of the present invention is attained by applying the aforementioned steps for forming an n-channel MOSFET and a p-channel MOSFET in a p-type well region and an n-type well region provided in the same semiconductor substrate while covering one of the well regions with a mask. In other words, it is possible to form impurity layers having impurity concentration distributions which are suitable for the respective conductivity types without changing configurations and dimensions of sidewall spacers, by appropriately selecting inclination angles and dose of impurities which are implanted into the respective well regions. Therefore, both sidewall spacers for the p-type well region and the n-type well region can be simultaneously formed through a common step.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention is now described with reference to FIGS. 8A to 8F.

FIGS. 8A to 8F are sectional views successively showing principal steps in a method of fabricating LDD-MOSFETs having triple diffusion structures according to an embodiment of the present invention.

Figure 1:
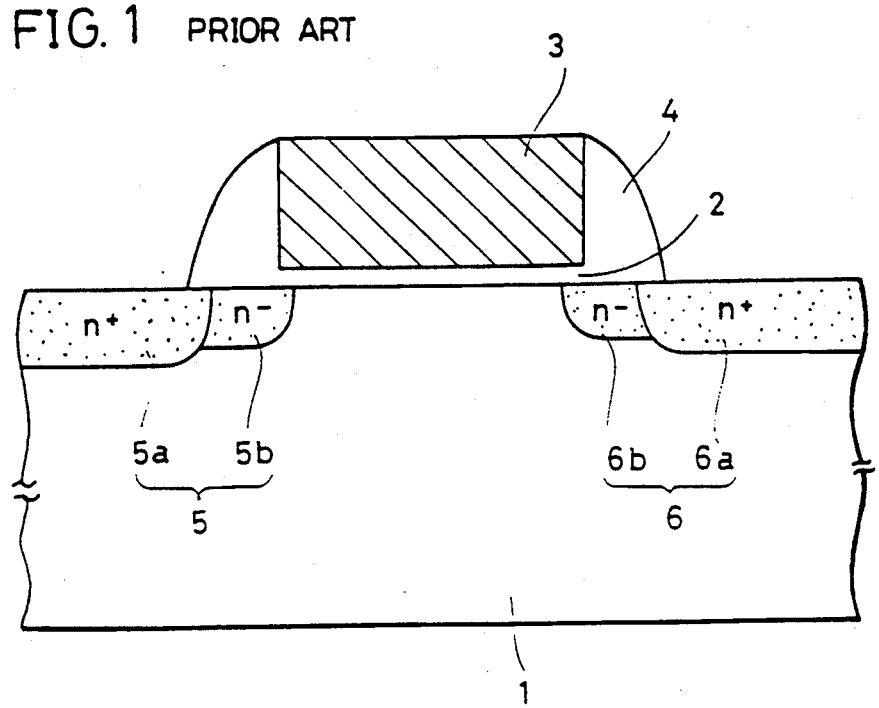
FIG. 1 is a sectional view showing the structure of an LDD-MOSFET according to first prior art.
Figure 3:
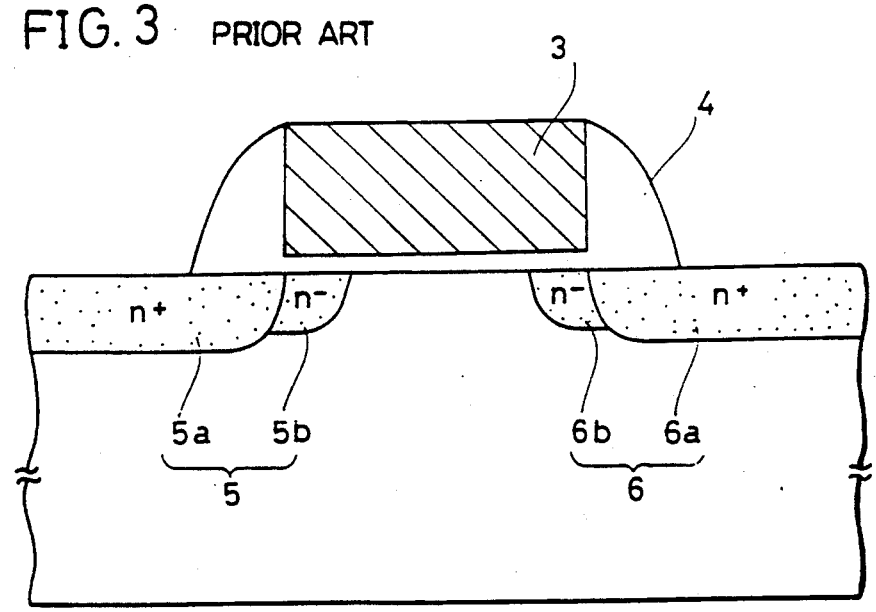
FIG. 3 is a sectional view showing the structure of an LDD-MOSFET according to second prior art.
Figure 2A:
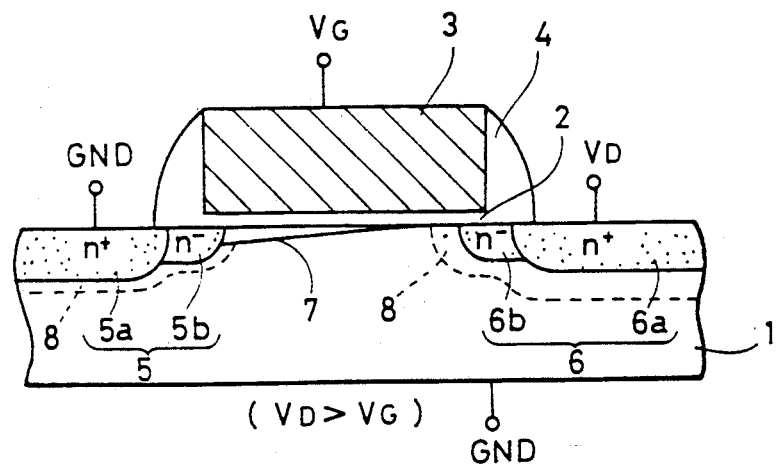
FIG. 2A is a sectional view showing a state of generation of a depletion layer in the so-called pentode region of the LDD-MOSFET according to the first prior art.
Figure 2B:
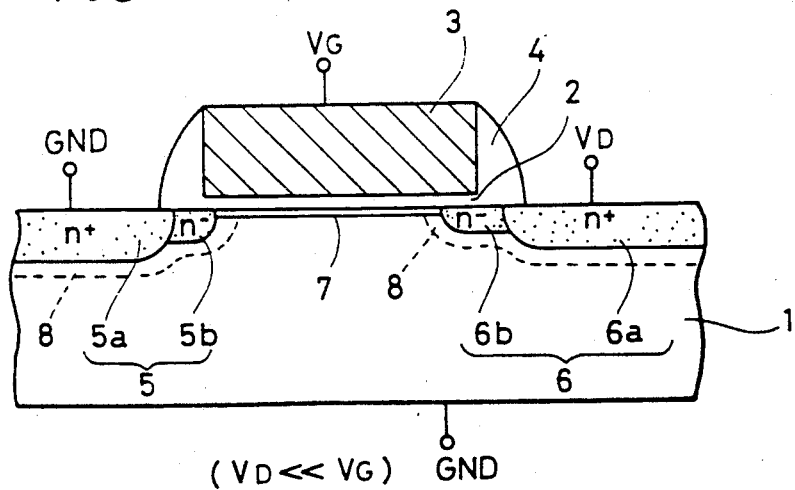
FIG. 2B is a sectional view showing a state of generation of a depletion layer in the so-called triode region of the LDD-MOSFET according to the first prior art.
Figure 4A:
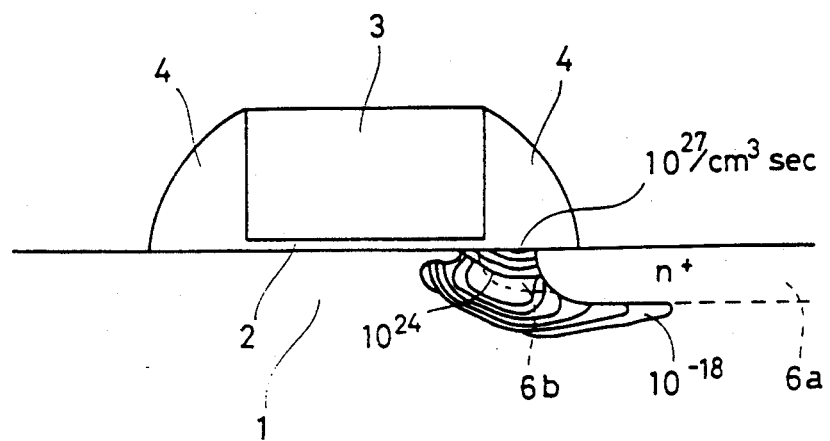
FIG. 4A illustrates a carrier generation rate distribution in a high-field drain region of the LDD-MOSFET according to the first prior art.
Figure 4B:
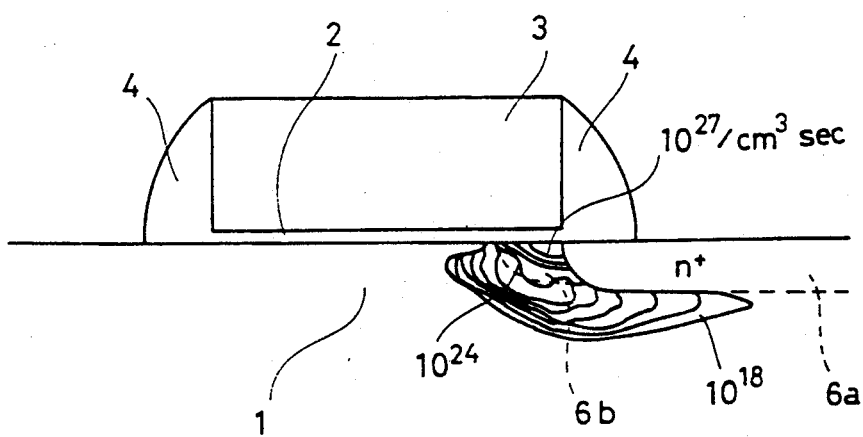
FIG. 4B illustrates a carrier generation rate distribution in a high-field drain region of the LDD-MOSFET according to the second prior art.
Figure 5A:
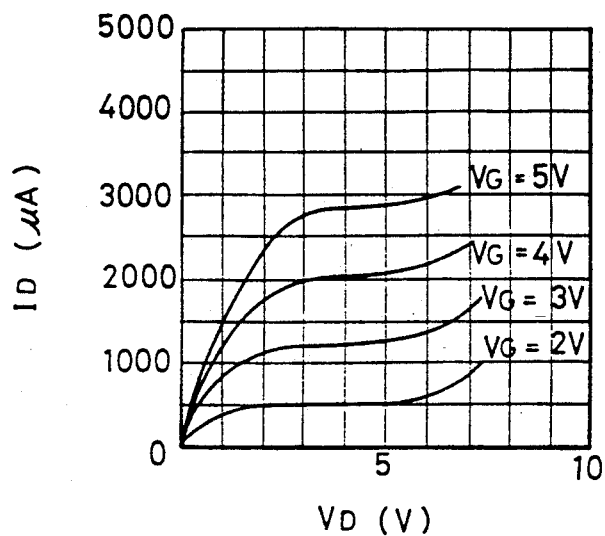
FIG. 5A illustrates characteristics of the LDD-MOSFET according to the first prior art.
Figure 5B:
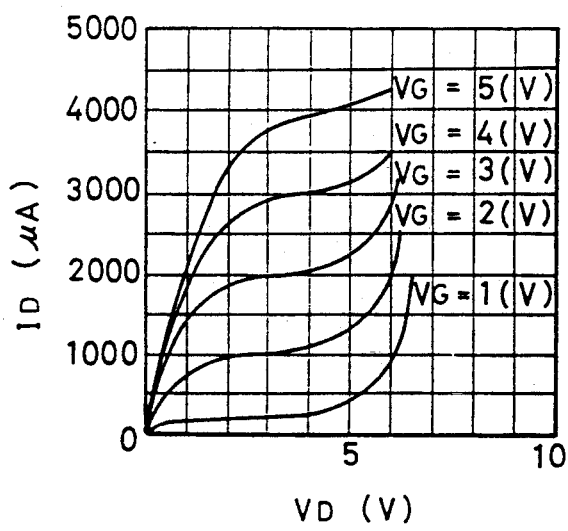
FIG. 5B illustrates those of the LDD-MOSFET according to the second prior art.
Figure 6:
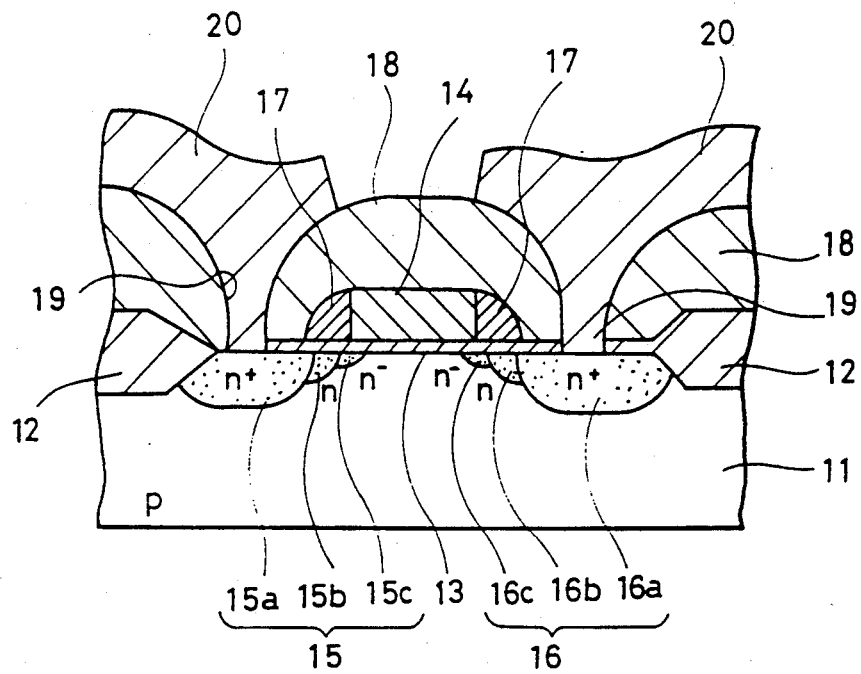
FIG. 6 is a sectional view showing an LDD-MOSFET having a triple diffusion structure according to third prior art.
Figure 7A:
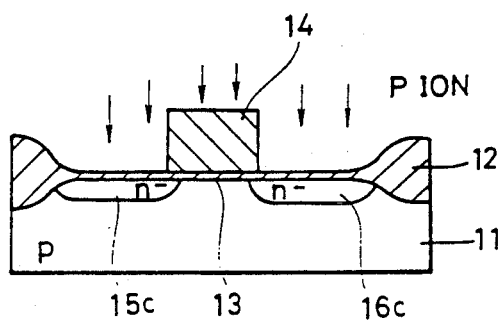
FIGS. 7A, 7B, 7C, 7D and 7E are sectional views successively showing steps of fabricating the LDD-MOSFET according to the third prior art.
Figure 7B:
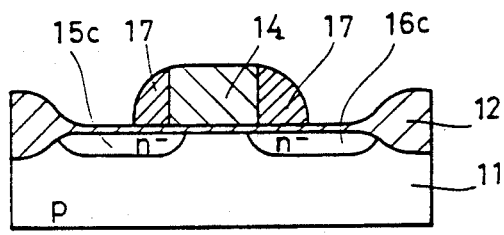
Figure 7C:
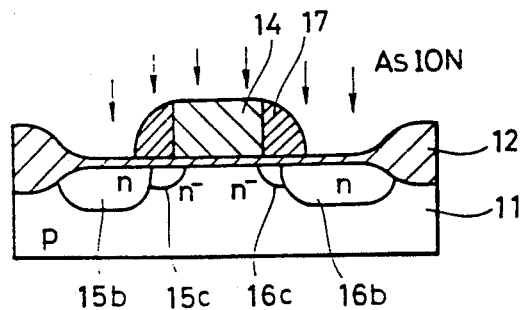
Figure 7D:
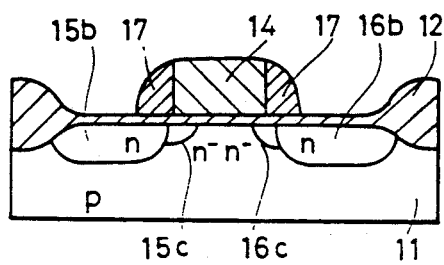
Figure 7E:
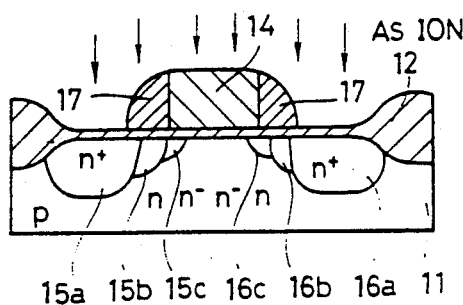
Figure 8A:
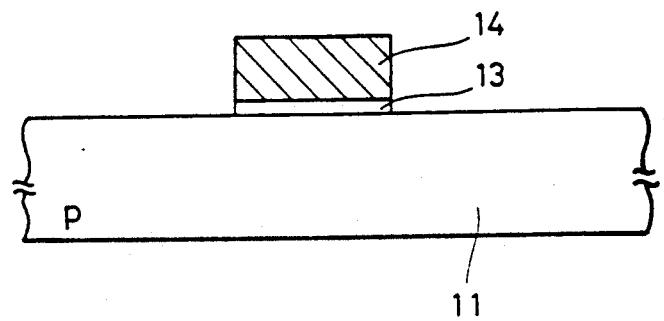
FIGS. 8A, 8B, 8C, 8D, 8E and 8F are sectional views successively showing principal steps in a method of fabricating a semiconductor device according to an embodiment of the present invention.

First, an element isolation region (not shown) is formed on a p-type semiconductor substrate 11, and an impurity is implanted into its channel in order to control the threshold voltage. Then, a thermal oxidation film and a polysilicon layer are successively formed for defining a gate insulating film 13 and a gate electrode 14 respectively. Thereafter a resist material is applied for pattern formation, and then the polysilicon layer is anisotropically etched for forming the gate electrode 14 (FIG. 8A).

Figure 8B:
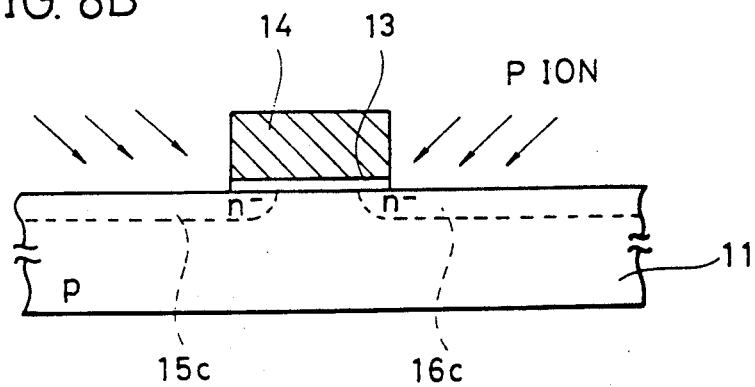
Figure 8C:
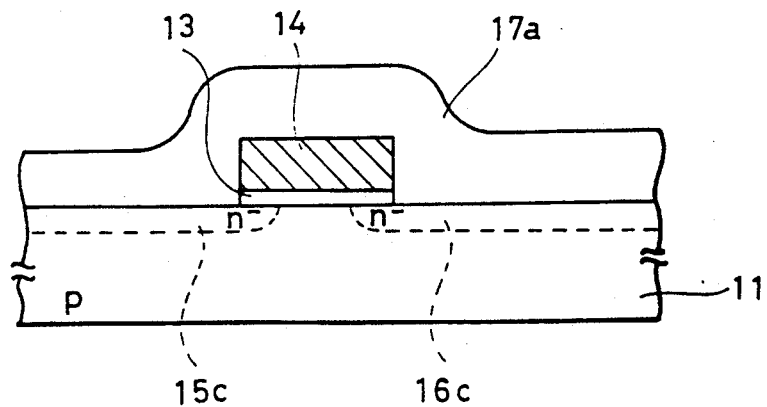

Then, the gate electrode 14 is used as a mask to obliquely implant an n-type impurity such as phosphorus, for example, in a dose of about $10^{13}/cm^2$ at an angle of about 45° with respect to the surface of the semiconductor substrate 11, thereby forming a pair of low-concentration n-type impurity layers 15c and 16c (FIG. 8B). In order to form such a pair of n-type impurity layers 15c and 16c, the semiconductor substrate 11 is rotated in a constant angular velocity in a plane which is parallel to its surface, to be subjected to the aforementioned oblique ion implantation. When the respective MOSFETs are arranged in the same direction, it is also possible to first form the low-concentration n-type impurity layer 15c by obliquely implanting the n-type impurity from above the left side of the gate electrode 14, then rotating the semiconductor substrate 11 by 90° or 180° in the plane which is parallel to its surface and thereafter fixing the substrate 11 for forming the other low-concentration n-type impurity layer 16c by obliquely implanting the n-type impurity from above the right side of the gate electrode 14.

Thereafter an oxide film 17a is formed over the entire surface of the semiconductor substrate 11 by CVD (FIG. 8C), and anisotropically etched to form sidewall spacers 17.

Figure 8D:
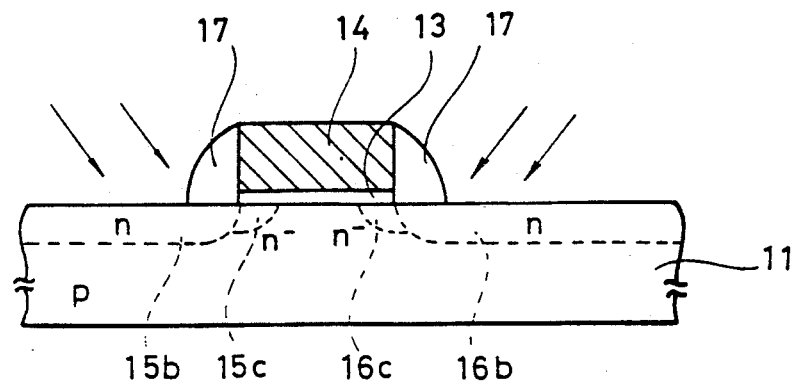

Then the gate electrode 14 and the sidewall spacers 17 are used as masks to obliquely implant an n-type impurity such as phosphorus or arsenic, for example, in a dose of about $10^{14}/cm^2$ at an angle of about 45° with respect to the semiconductor substrate 11, to form a pair of medium-concentration n-type impurity layers 15b and 16b (FIG. 8D). Also in this case, the semiconductor substrate 11 must be rotated in a plane which is parallel to its surface to be subjected to the oblique ion implantation, in order to form the pair of n-type impurity layers 15b and 16b.

Figure 8E:
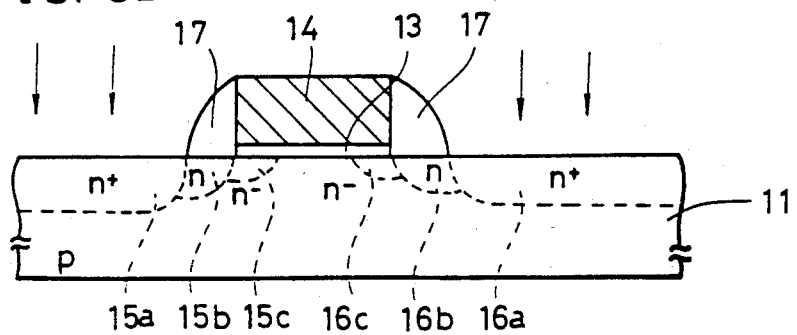

Then, the gate electrode 14 and the sidewall spacers 17 are again used as masks to implant an n-type impurity such as arsenic, for example, in a dose of about $10^{15}/cm^2$ substantially perpendicularly with respect to the surface of the semiconductor substrate 11, to form high-concentration n-type impurity layers 15a and 16a (FIG. 8E). In this case, the direction of the ion implantation should be inclined about 7° C. from the normal direction for preventing channeling.

Figure 8F:
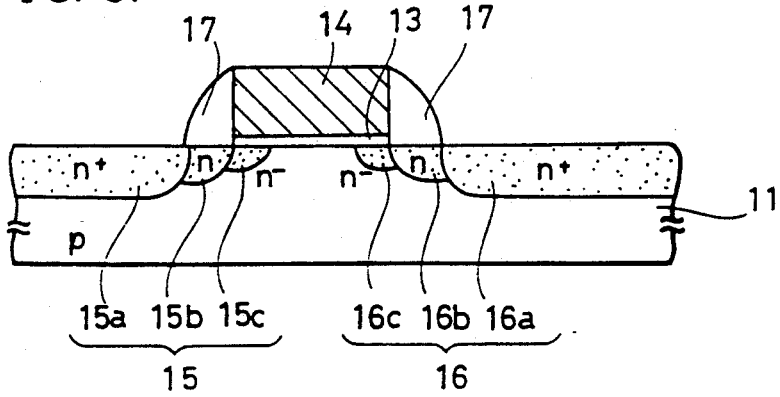

Thereafter heat treatment is performed to activate the implanted impurities, thereby finally obtaining source and drain regions 15 and 16 having impurity profiles as shown in FIG. 8F.

In the aforementioned method according to this embodiment, the low-concentration n-type impurity layers 15c and 16c are overlapped with the gate electrode 14 and the medium-concentration n-type impurity layers 15b and 16b are formed immediately under the sidewall spacer 17 by oblique ion implantation, through which concentration distributions can be relatively easily controlled as compared with thermal diffusion, with no heat treatment steps for thermal diffusion. Thus, it is relatively easy to form the source and drain regions 15 and 16 having impurity concentration distributions of desired profiles. While heat treatment for thermally diffusing an impurity layer must be performed at a temperature of 900° to 950° C. for at least 60 minutes, the heat treatment for activating the impurity may be performed at a temperature of not more than 900° C. for about 30 minutes, and no problem is caused since substantially no diffusion takes place in the impurity layer.

According to the fabrication steps of this embodiment, therefore, it is possible to relatively easily obtain an LDD-MOSFET of a triple diffusion structure, which has an effect of preventing hot carriers by excellent field strength relaxation and an effect of suppressing reduction of current drivability resulting from increase in resistance of the source and drain regions in relation to reduction of the channel length following high integration.

While the above embodiment has been described with reference to the steps of forming an n-channel MOSFET with the p-type semiconductor substrate 11 and the n-type impurity layers for forming the source and drain regions 15 and 16, the present invention is also applicable to a p-channel MOSFET formed by elements whose conductivity types are entirely reverse to the above, as a matter of course.

The gate electrode 14, which is formed by a polycrystalline silicon single layer in the aforementioned embodiment, may alternatively be formed of another material such as a high melting point metal silicide or a high melting point metal, or of a laminated film of such materials. Further, the sidewall spacers 17, which are formed by oxide films in the above embodiment, may alternatively be formed of other materials such as nitride films or laminated films thereof.

Another embodiment of the present invention is now described with reference to FIGS. 9A to 9I, which successively show principal steps of fabricating a CMOSFET according to the present invention.

Figure 9A:
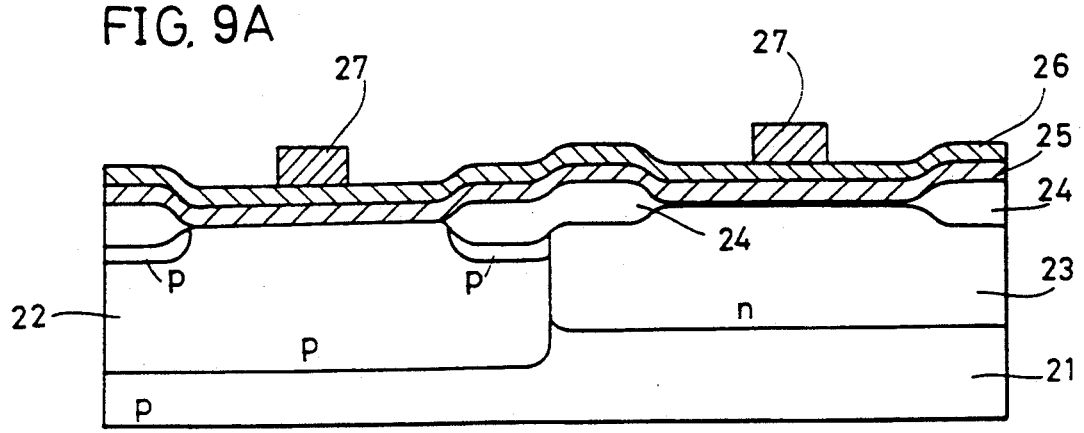
FIGS. 9A, 9B, 9C, 9D, 9E, 9F, 9G, 9H and 9I are sectional views successively showing principal steps in a method of fabricating a semiconductor device according to another embodiment of the present invention.

According to this embodiment, a p-type well 22 and an n-type well 23 are first formed on the surface of a p-type semiconductor substrate 21, and then active regions on the respective wells 22 and 23 are isolated/insulated by an isolation film 24. Thereafter a polysilicon layer 25 and a tungsten silicide layer 26 are successively formed over the entire surface of the semiconductor substrate 21, and resist films 27 are formed for patterning (FIG. 9A). Thereafter the polysilicon layer 25 and the tungsten silicide layer 26 are etched to form gate electrodes 28 and 29.

Figure 9B:
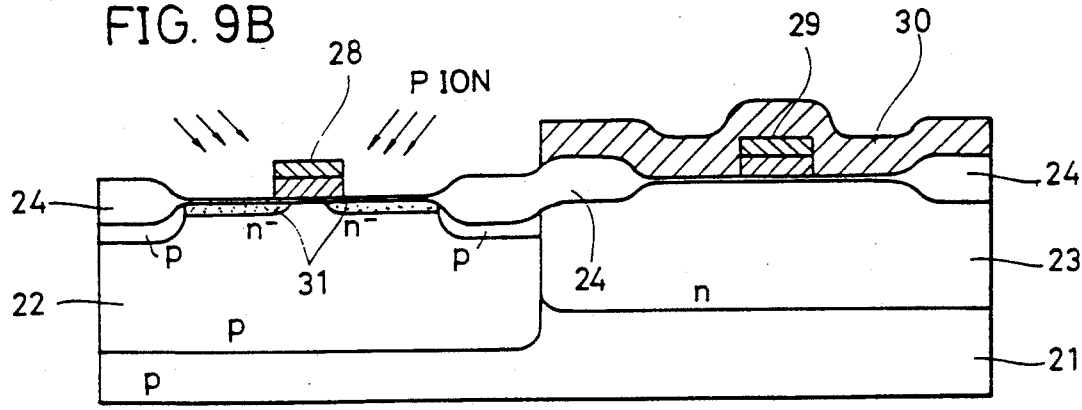

Then, the region over the n-type well 23 is entirely covered with a resist film 30, and phosphorus ions are implanted into the surface of the p-type well 22 using the gate electrode 28 as a mask, to form a pair of low-concentration n-type impurity layers 31 (FIG. 9B). In order to overlap portions around opposite ends of the low-concentration n-type impurity layers 31 with the gate electrode 28 by prescribed lengths, the semiconductor substrate 21 is rotated in a plane which is parallel to its surface for obliquely implanting the phosphorus ions at a prescribed angle with respect to the surface of the semiconductor substrate 21. The n-type impurity for such implantation is mainly prepared from phosphorus ions (P+), while the same may alternatively be prepared from arsenic ions (As+) or antimony ions (Sb+). Ion implantation conditions are so set that the implantation energy is 20 to 150 KeV, preferably about 100 KeV, the dose is $5 \times 10^{12}$ to $1 \times 10^{14}/cm^2$, preferably $2 \times 10^{13}/cm^2$, and the inclination angle is 20° to 60°, mainly 45°, with respect to the surface of the semiconductor substrate 21. Such ion implantation conditions must be appropriately selected in response to overlap lengths with respect to the gate electrode 28, in addition to concentrations and depths of the low-concentration n-type impurity layers 31 to be formed.

Figure 9C:
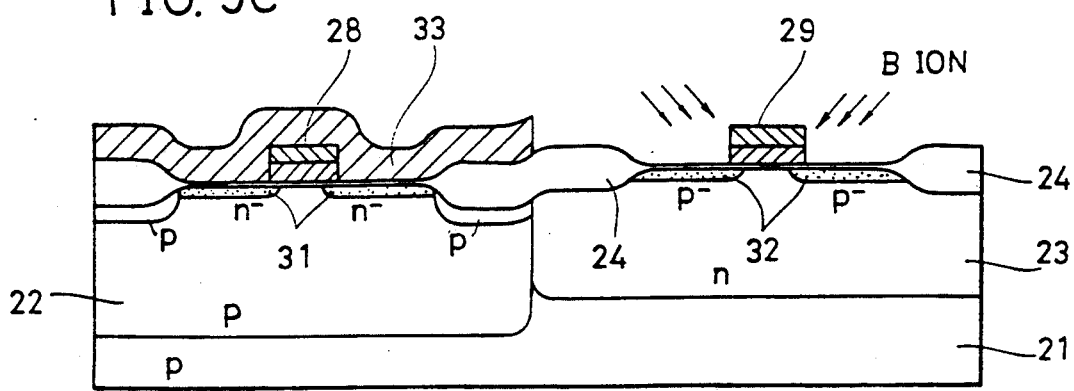

Then, the resist film 30 is removed and the overall surface of the p-type well 22 is covered with another resist film 33, to implant a p-type impurity into the surface of the n-type well 23 using the gate electrode 29 as a mask, thereby forming low-concentration p-type impurity layers 32 (FIG. 9C). Also in this case, the semiconductor substrate 21 is rotated for oblique ion implantation, similarly to the above step of forming the low-concentration n-type impurity layers 31. The p-type impurity for such implantation is mainly prepared from boron ions (B+), while the same may alternatively be prepared from BF$_2$ ions. When boron ions are employed, ion implantation conditions are so set that the implantation energy is 10 to 30 KeV, the dose is $5 \times 10^{12}$ to $5 \times 10^{13}/cm^2$ and the inclination angle is 20° to 60°. When BF$_2$ ions are employed, on the other hand, the implantation energy must be 30 to 60 KeV.

Figure 9D:
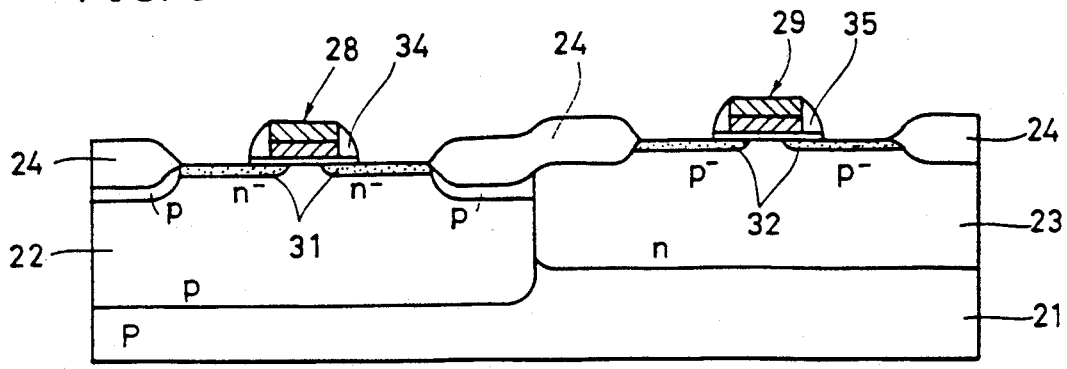

Then the resist film 33 is removed and thereafter an oxide film is deposited over the entire surface of the semiconductor substrate 21 in a thickness of about 2000 Å. Thereafter this oxide film is anisotropically etched, thereby forming sidewall spacers 34 and 35 on respective sidewalls of the gate electrodes 28 and 29 (FIG. 9D). According to this embodiment, concentration distributions of the impurity layers in source and drain regions are controlled with no thermal diffusion, and hence it is not necessary to make the widths of the sidewall spacers 34 and 35 different from each other in response to difference between thermal diffusion coefficients of the implanted impurity ions. Therefore, it is possible to simultaneously form the sidewall spacers 34 and 35.

Figure 9E:
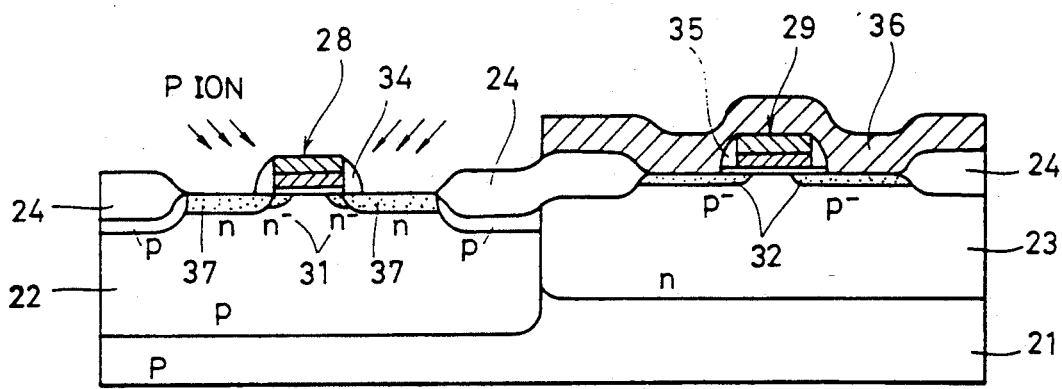

After the sidewall spacers 34 and 35 are formed, the surface over the n-type well 23 is again entirely covered with a resist film 36, and the semiconductor substrate 21 is rotated so that phosphorus ions are obliquely implanted with respect to the surface of the semiconductor substrate 21 using the gate electrode 28 and the sidewall spacers 34 as masks, in order to form a pair of medium-concentration n-type impurity layers 37 (FIG. 9E). At this time, ion implantation conditions are so set that the implantation energy is 20 to 150 KeV, preferably 100 KeV, the dose is $1 \times 10^{13}$ to $5 \times 10^{14}/cm^2$, i.e., at least in excess of that for forming the n-type impurity layers 31 and preferably about $1 \times 10^{14}/cm^2$, and the inclination angle with respect to the surface of the semiconductor substrate 21 is 20° to 60°, preferably about 45° in response to the widths of the sidewall spacers 34 etc.

Figure 9F:
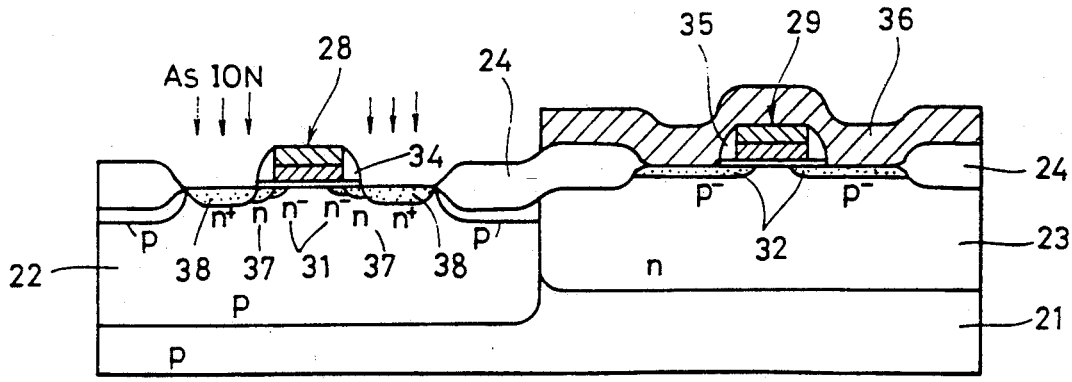

Then, the gate electrode 28 and the sidewall spacers 34 are again used as masks to substantially perpendicularly implant arsenic ions into the surface of the semiconductor substrate 21, which is fixed this time, with an inclination of about 7° from the normal direction in order to prevent channeling, thereby forming a pair of high-concentration n-type impurity layers 38 (FIG. 9F). At this time, ion implantation conditions are so selected that the implantation energy is 30 to 80 KeV, preferably about 50 KeV, and the dose is $1 \times 10^{15}$ to $1 \times 10^{16}/cm^2$, preferably $5 \times 10^{15}/cm^2$.

Figure 9G:
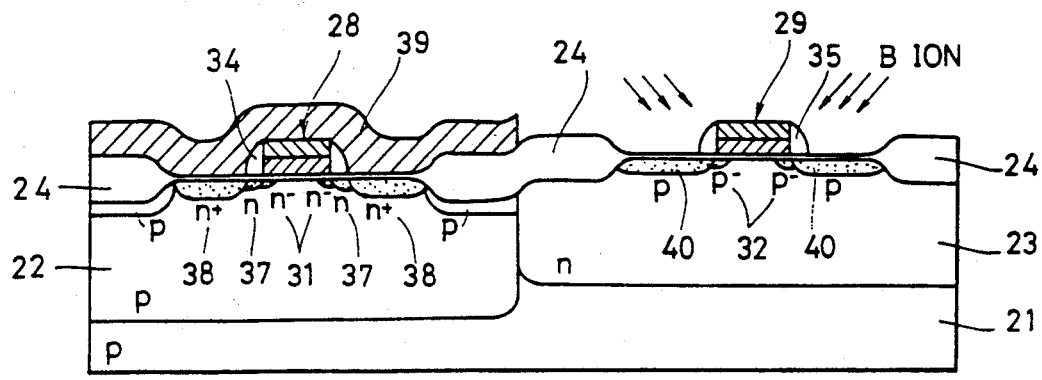

Then, the resist film 36 is removed and thereafter the surface over the p-type well 22 is entirely covered with a resist film 39, and the semiconductor substrate 21 is rotated to obliquely implant boron ions or BF$_2$ ions into the surface of the n-type well 23 using the gate electrode 29 and the sidewall spacers 35 as masks, thereby forming medium-concentration p-type impurity layers 40 (FIG. 9G). Implantation conditions for the boron ions are so selected that the implantation energy is 10 to 30 KeV, the dose is $1 \times 10^{13}$ to $1 \times 10^{14}/cm^2$, and the inclination angle with respect to the surface of the semiconductor substrate 21 is 20° to 60°. In the case of BF$_2$ ions, on the other hand, only the implantation energy must be changed to 20 to 60 KeV, while other conditions may be identical to those for the boron ions.

Figure 9H:
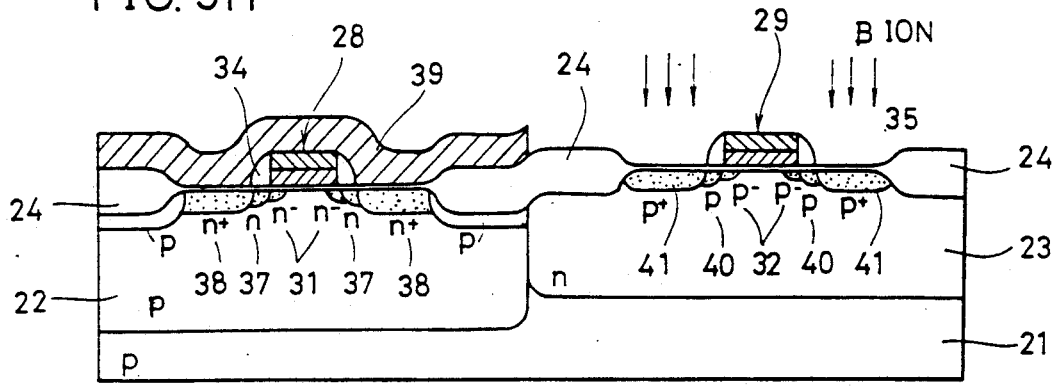

Then, the gate electrode 29 and the sidewall spacer 35 are again used as masks to substantially perpendicularly implant boron ions or BF$_2$ ions with respect to the semiconductor substrate 21 with an inclination of about 7° from the normal direction in order to prevent channeling, thereby forming high-concentration p-type impurity layers 41 (FIG. 9H). As to ion implantation conditions, the dose is set at $1 \times 10^{15}$ to $1 \times 10^{16}/cm^2$, while the implantation energy is set similarly to the above.

Thereafter heat treatment is performed at 900° C. for about 30 minutes to activate the respective impurity layers, thereby completing source regions 42 and 43 as well as drain regions 44 and 45 of triple diffusion structures. Then, oxide films are deposited by CVD to form interlayer isolation films 46 while conductive wiring layers 47 of aluminum or the like are formed, to attain the structure shown in FIG. 9I.

The present invention is applied to simultaneous formation of n-channel and p-channel MOSFETs on the same semiconductor substrate 21 as described above in relation to the embodiment, whereby it is possible to form n-channel and p-channel MOSFETs having triple diffusion structures using the sidewall spacers 34 and 35 of the same widths, regardless of difference between thermal diffusion coefficients of phosphorus ions and boron ions, or the like. Thus, it is possible to simultaneously form the sidewall spacers 34 and 35, thereby simplifying the steps. The structure formed according to the present invention to include both n-channel and p-channel MOSFETs on the same semiconductor substrate is applicable to formation of a CMOS device for a DRAM, a BiCMOS device applied to a DRAM or a microcomputer, i.e., a device including an npn bipolar transistor, an n-channel MOSFET and a p-channel MOSFET, a CBiCMOS device, i.e., a device including an npn or pnp bipolar transistor, an n-channel MOSFET and a p-channel MOSFET, or the like.

In this embodiment, CMOSFET with a p-channel MOSFET and n-channel MOSFET having triple layer LDD structures is described, however, it is also possible to apply the present invention for fabricating CMOSFETs with other structures by making appropriate choices of ion implanting steps.

Figure 10:
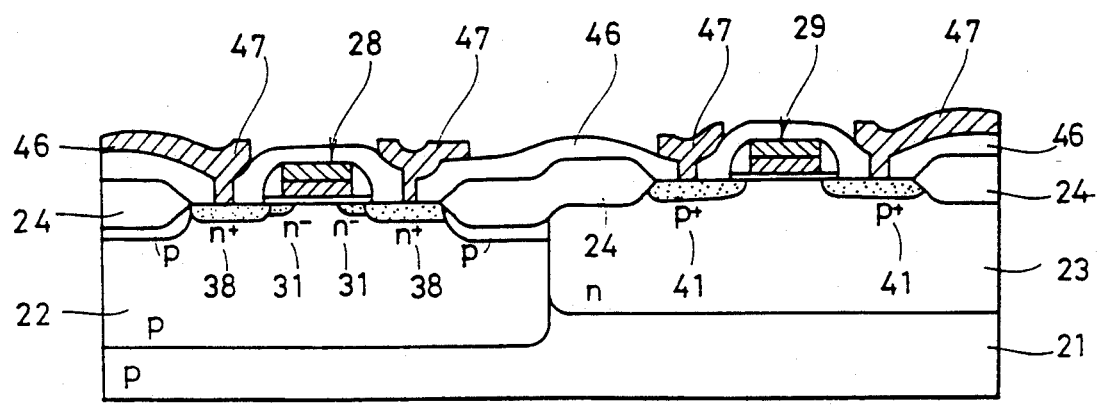
FIG. 10 is a sectional view showing a CMOSFET having a n-channel MOSFET with a double layer LDD structure and a p-channel MOSFET with a single layer source/drain structure.

For example, the present invention can be applied to the method of fabricating CMOSFET with a n-channel MOSFET having a double layer LDD structure and a p-channel MOSFET having a single source/drains structure shown in FIG. 10 as follows.

First of all, as shown in FIG. 9B, the region over the n-type well 23 is entirely covered with resist film 30, and the semiconductor substrate 21 is rotated so that phosphorus ions are implanted obligely with respect to the surface of the semiconductor substrate 21 using the gate electrode 28 as a mask, to form a pair of low-concentration n-type impurity layers 31.

Then, the resist film 30 is removed and thereafter an oxide film is deposited over the entire surface of the semiconductor substrate 21 in a thickness of about 2000 Å. Thereafter this oxide film is anisotropically etched, thereby forming sidewall spacers 34 and 35 on respective sidewalls of the gate electrodes 28 and 29 simultaneously, as shown in FIG. 9D.

Next, as shown in FIG. 9F, the surface over the n-type well 23 is again entirely covered with a resist film 36 and phosphorus ions are implanted substantially perpendicularly with respect to the semiconductor substrate 21 using the gate electrode 28 and the sidewall spacers 34 as masks, to form a pair of high-concentration n-type impurity layers 38.

Then, the resist film 36 is removed and thereafter the surface over the p-type well 22 is entirely covered with resist film 39 and form ions are implanted substantially perpendicularly with respect to the semiconductor substrate 21 using the gate electrode 29 and the sidewall spacers 35 as masks, thereby forming high-concentration p-type impurity layers 41 as shown in FIG. 9H.

Figure 9I:
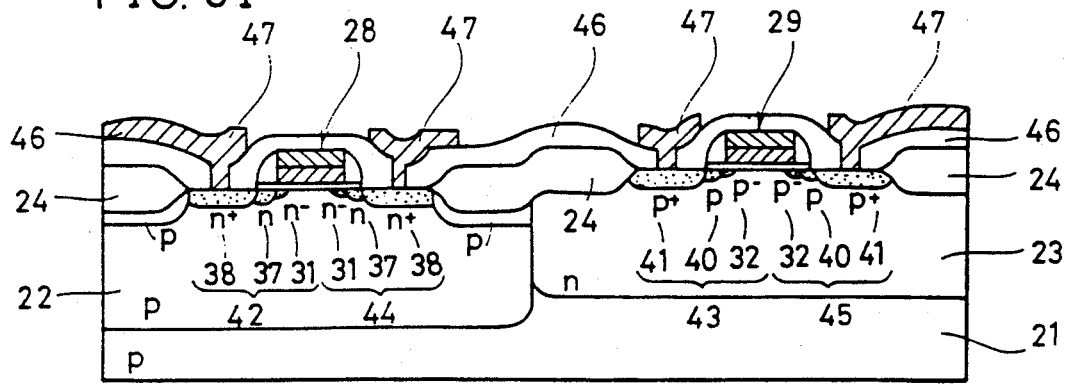

Thereafter, the same steps can be applied as those of the above described embodiment explained with referring to FIG. 9I.

Through the steps described above, the CMOSFET with a n-channel MOSFET having a double layer LDD sturcture and a p-channel MOSFET having a single layer source/drain structure can be fabricated without any step of thermal diffusion.

A method of fabricating a semiconductor device according to still another embodiment of the present invention is now described with reference to FIGS. 11A to 11F.

Figure 11A:
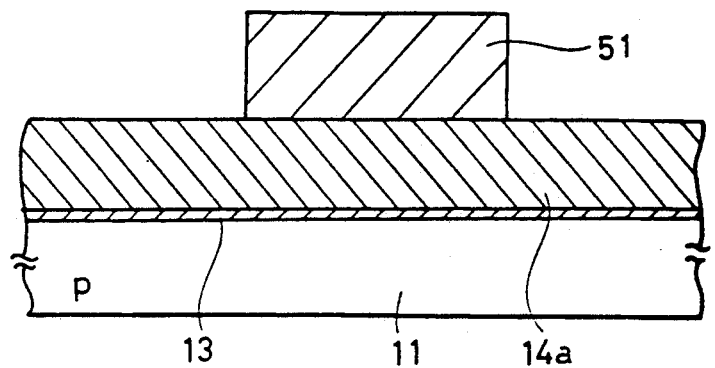
FIGS. 11A, 11B, 11C, 11D, 11E and 11F are sectional views successively showing principal steps in a method of fabricating a semiconductor device according to still another embodiment of the present invention.
Figure 11B:
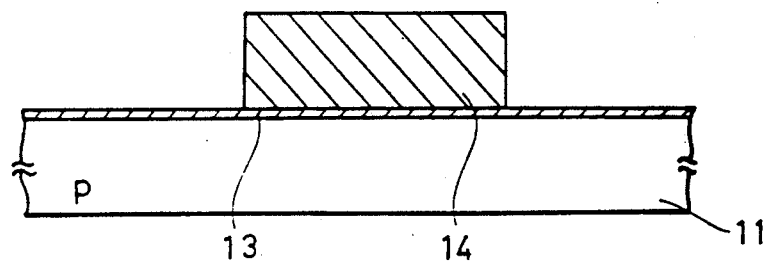

Referring to FIG. 11A, a gate insulating film 13, which is an oxide film of silicon dioxide, is formed on a p-type semiconductor substrate 11 by thermal oxidation. A polycrystalline silicon layer 14a is deposited on the gate insulating film 13, and a resist film 51 is applied thereto for patterning. Thereafter the resist film 51 is used as a mask to etch the polycrystalline silicon layer 14a by reactive ion etching, thereby forming a gate electrode 14 (FIG. 11B).

Figure 11C:
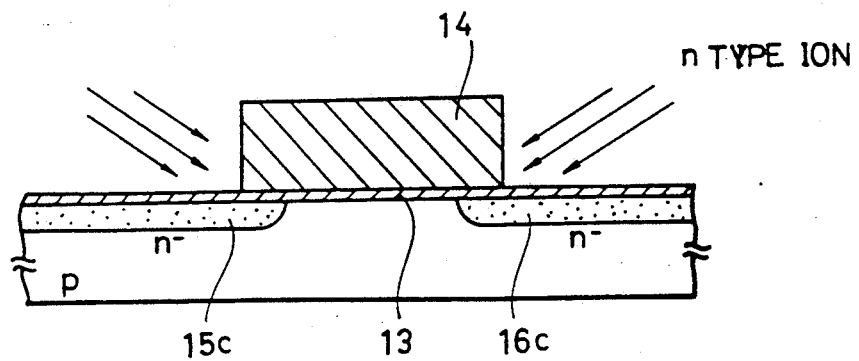
Figure 11D:
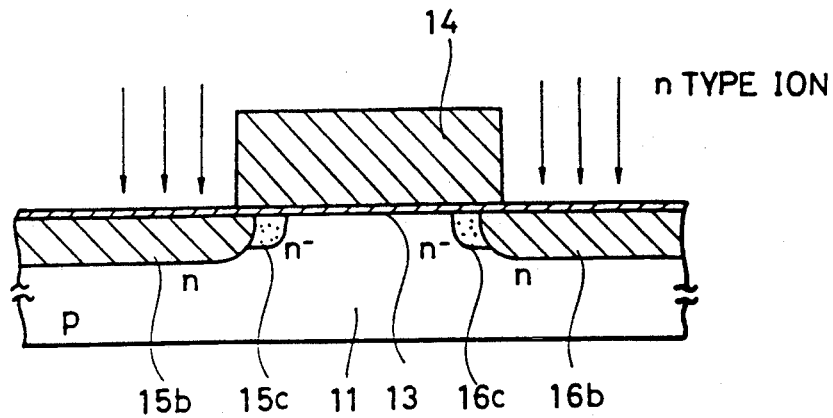
Figure 11E:
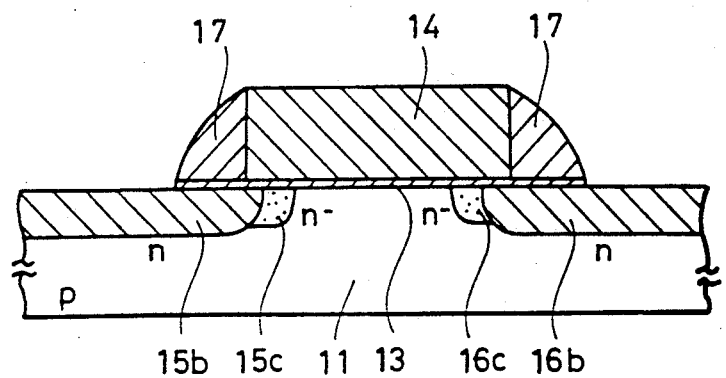
Figure 11F:
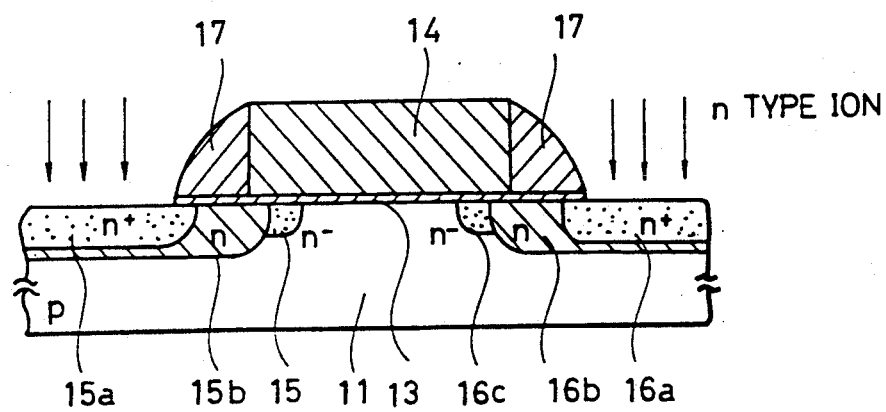

Then, n-type impurity ions such as phosphorus ions are obliquely implanted with respect to the gate electrode 14, to form low-concentration n-type impurity layers 15c and 16c (FIG. 11C). Further, phosphorus ions or the like are implanted with respect to the p-type semiconductor substrate 11 substantially from its normal direction (generally inclined at an angle of about 7° for preventing channeling), to form medium-concentration n-type impurity layers 15b and 16b (FIG. 11D). Thereafter an insulating film of silicon oxide etc. is deposited over the entire surface of the p-type semiconductor substrate 11 by CVD, and this insulating film is anisotropically etched to form sidewall spacer 17 (FIG. 11E). Thereafter arsenic ions or the like are substantially perpendicularly implanted with respect to the surface of the p-type semiconductor substrate 11 using the gate electrode 14 and the sidewall spacers 17 as masks, to form high-concentration n-type impurity layers 15a and 16a (FIG. 11F). Thereafter heat treatment is performed to activate the implanted impurity ions, thereby attaining a sectional structure which is similar to that shown in FIG. 8F.

Also in this embodiment, the medium-concentration n-type impurity layers 15b and 16b are obtained with no heat treatment for thermal diffusion. In the embodiment shown in FIGS. 8A to 8F, it is possible to change positions of channel-side end portions of the medium-concentration n-type impurity layers 15b and 16b by changing the inclination angle of ion implantation since the medium-concentration n-type impurity layers 15b and 16b are formed by oblique ion implantation. According to this embodiment, on the other hand, positions of channel-side end portions of the medium-concentration n-type impurity layers 15b and 16b are specifically determined around portions close to those immediately under sidewalls of the gate electrode 14, since the medium-concentration n-type impurity layers 15b and 16b are formed by perpendicular ion implantation.

In this embodiment, however, the medium-concentration n-type impurity layers 15b and 16b are thermally diffused a little under the influence of the subsequent heat treatment for forming the sidewall spacer 17. Therefore, concentrations of the impurity layers overlapped with the gate electrode 14 are relatively increased, to reduce the effect of relaxing the field strength to some extent. According to the aforementioned embodiment explained with reference to FIGS. 8A to 8F, on the other hand, the medium-concentration n-type impurity layers 15b and 16b are formed after formation of the sidewall spacers 17, whereby the medium-concentration n-type impurity layers 15b and 16b are not influenced by heat treatment for forming the sidewall spacer 17.

The concept of the present invention can be applied to double layer LDD MOSFETs as well as triple layer LDDMOSFETs.

FIGS. 12A to 12F are sectional views successively showing principal steps in a method of fabricating a LDDMOSFET having double diffusion a structure according to an embodiment of the present invention.

Figure 12A:
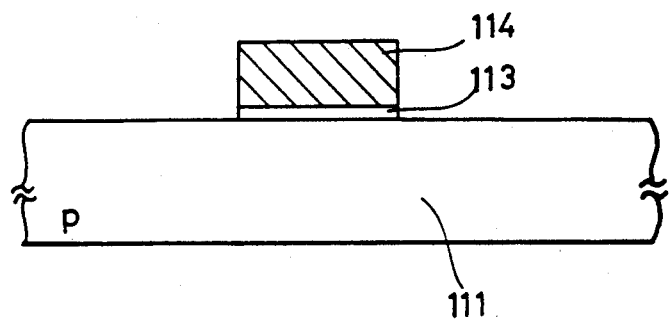
FIGS. 12A, 12B, 12C, 12D, 12E and 12F are sectional views successively showing principal steps in a method of fabricating a double layer LDDMOSFET according to the present invention.
Figure 12B:
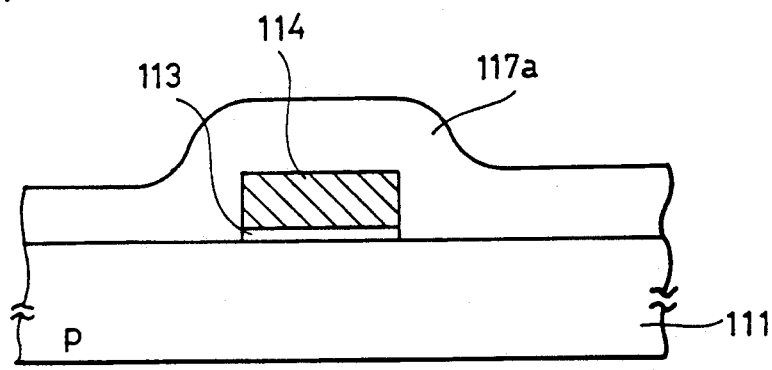

First, an element isolation region (not shown) is formed on a p-type semiconductor substrate 111, and an impurity is implanted into its channel in roder to control the threshold voltage. Then, a thermal oxidation film and a polycrystalline silicon layer are successively formed for definning a gate insulating film 113 and a gate electorde 114 respectively. Thereafter a resist material is applied for pattern formation, and then the polycrystalline silicon layer is anisotropically etched for forming the gate elctrode 114 (FIG. 12A).

Figure 12C:
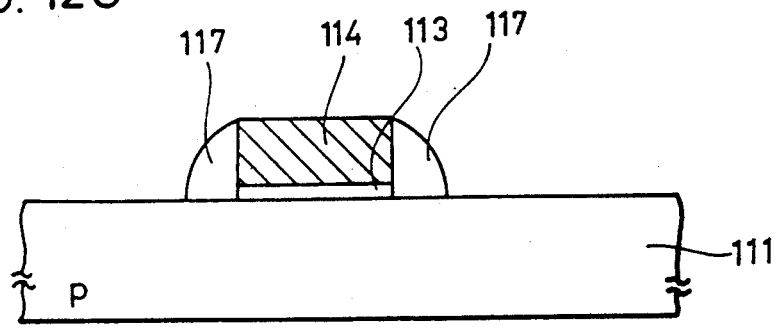

Then, an oxide film 117a is formed over the entire surface of the semiconductor substrate 111 by CVD (FIG. 12B), and anisotropically etched to form sidewall spacers 117 (FIG. 12C).

Figure 12D:
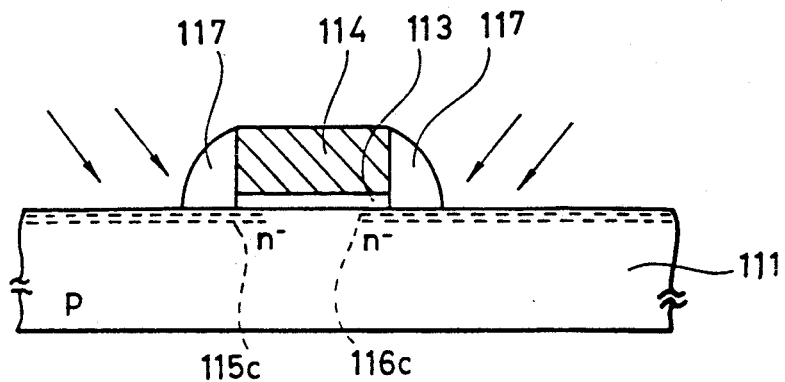

Then, the gate electrode 114 and the sidewall spacers 117 are used as masks to obliguely implant an n-type impurity such as phosphorus or arsenic, for example, in a dose of 45° with respect to the semiconductor substrate 111, to form a pair of low-concentration n-type impurity layers 115c and 116c (FIG. 12D). In this obigue ion-implantation, the semiconductor substrate 111 must be rotated in a plane which is parallel to its surface to be subjected to the ion-implantation.

Figure 12E:
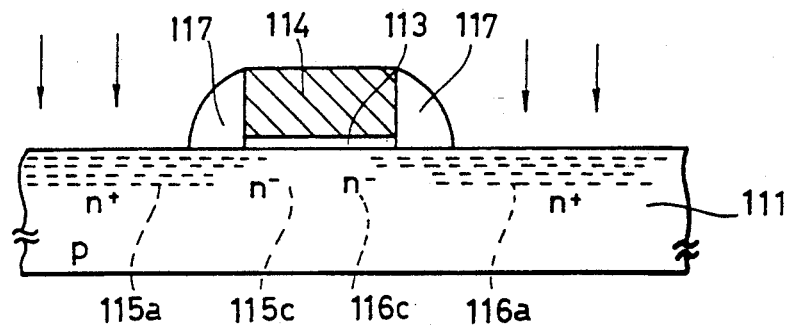

Thereafter, the gate electrode 114 and the sidewall spacers 117 are again used as masks to implant an n-type impurity such as arsenic, for example, in a dose of about $10^{15}/cm^2$ substantially perpendicularly with respect to the surface of the semiconductor substrate 111, to form high-concentration n-type impurity layers 115a and 116a, as shown in FIG. 12E. In this case, the direction of the ion implantation should be inclined about 7° from the normal direction for preventing channeling.

Figure 12F:
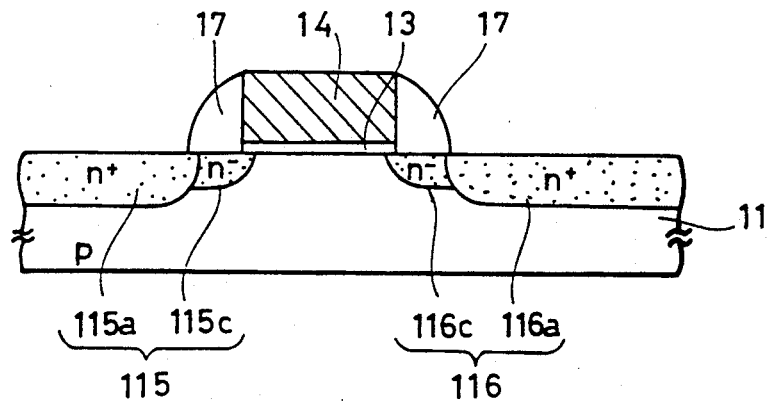

Thereafter heat treatment is performed to activate the implanted impurities, thereby finally obtaining source and drains regions 115 and 116 having impurity profiles as shown in FIG. 12F.

In the aforementioned method according to this embodiment, the low-concentration n-type impurity layers 115c and 116c and the high-concentration n-type impurity layers 115a and 116a having impurity concentration destribution of described profiles are formed comparatively easily without a step of thermal diffusion.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of fabricating a semiconductor device comprising the steps of:
    forming a gate electrode on a first conductivity type semiconductor substrate having a major surface with a gate insulating film therebetween;
    forming a low-concentration impurity layer by obliquely implanting a second conductivity type impurity at a prescribed angle with respect to the major surface of said semiconductor substrate, using said gate electrode as a mask;
    forming sidewall spacers on sidewalls of said gate electrode;
    forming a medium-concentration impurity layer by obliquely implanting a second conductivity type impurity at a prescribed inclination angle with respect to the surface of said semiconductor substrate, using said gate electrode and said sidewall spacer as masks; and
    forming a high-concentration impurity layer by substantially perpendicularly implanting a second conductivity type impurity with respect to the surface of said semiconductor substrate, using said gate electrode and said sidewall spacer as masks.

2. A method of fabricating a semiconductor device in accordance with claim 1, wherein an angle formed by the direction of impurity implantation and the surface of said semiconductor substrate is at least 20° and not more than 60° in each of said steps of forming said low-concentration impurity layer and said medium-concentration impurity layer.

3. A method of fabricating a semiconductor device in accordance with claim 1, wherein the direction of impurity implantation in the step of fabricating said high-concentration impurity layer is inclined from a normal direction of the surface of said semiconductor substrate by an angle of about 7°, which is the minimum inclination angle for preventing channeling.

4. A method of fabricating a semiconductor device in accordance with claim 1, wherein said first conductivity type is a p type and said second conductivity type is an n type, while dose of said n-type impurities in said steps of forming said low-concentration impurity layer, said medium-concentration impurity layer and said high-concentration impurity layer are about $10^{13}/cm^2$, about $10^{14}/cm^2$ and about $10^{15}/cm^2$ respectively.

5. A method of fabricating a semiconductor device in accordance with claim 1, wherein said semiconductor substrate is rotated in a plane which is parallel to its surface, for implanting said impurities in said steps of forming said low-concentration impurity layer and said medium-concentration impurity layer.

6. A method of fabricating a semiconductor device comprising the steps of:
    forming a gate electrode on a first conductivity type semiconductor substrate with a gate insulating film therebetween;
    forming a low-concentration impurity layer by obliquely implanting a second conductivity type impurity at a prescribed angle with respect to the surface of said semiconductor substrate, using said gate electrode as a mask;
    forming a medium-concentration impurity layer by substantially perpendicularly implanting a second conductivity type impurity with respect to the surface of said semiconductor substrate, using said gate electrode as a mask;
    forming a sidewall spacer on a sidewall of said gate electrode; and
    forming a high-concentration impurity layer by substantially perpendicularly implanting a second conductivity type impurity with respect to the surface of said semiconductor substrate, using said gate electrode and said sidewall spacer as masks.

7. A method of fabricating a semiconductor device in accordance with claim 6, wherein an angle formed by the direction of impurity implantation and the surface of said semiconductor substrate is at least 20° and not more than 60° in each of said step of forming said low-concentration impurity layer.

8. A method of fabricating a semiconductor device in accordance with claim 6, wherein the directions of impurity implantation in the steps of fabricating said medium-concentration and high-concentration impurity layers are inclined from a normal direction of the surface of said semiconductor substrate by an angle of about 7°, which is the minimum inclination angle for preventing channeling.

9. A method of fabricating a semiconductor device in accordance with claim 6, wherein said first conductivity type is a p type and said second conductivity type is an n type, while dose of said n-type impurities in said steps of forming said low-concentration impurity layer, said medium-concentration impurity layer and said high-concentration impurity layer are about $10^{13}/cm^2$, about $10^{14}/cm^2$ and about $10^{15}/cm^2$ respectively.

10. A method of fabricating a semiconductor device in accordance with claim 6, wherein said semiconductor substrate is rotated in a plane which is parallel to its surface, for implanting said impurities in said steps of forming said low-concentration impurity layer and said medium-concentration impurity layer.

11. A method of fabricating a semiconductor device comprising the steps of:
preparing a p-type semiconductor substrate;
forming a low-concentration impurity layer by rotating said semiconductor substrate in a plane being parallel to its surface and implanting an n-type impurity at an inclination angle of at least 20° and not more than 60° with respect to the surface of said semiconductor substrate in a dose of about $10^{13}/cm^2$, using a gate electrode as a mask;
depositing an oxide film over the entire surface of said semiconductor substrate and anisotropically etching the same for forming a sidewall spacer on a sidewall of said gate electrode;
forming a medium-concentration impurity layer by rotating said semiconductor substrate in a plane being parallel to its surface and implanting an n-type impurity at an inclination angle of at least 20° and not more than 60° with respect to the surface of said semiconductor substrate in a dose of about $10^{14}/cm^2$, using said gate electrode and said sidewall spacer as masks; and
forming a high-concentration impurity layer by implanting an n-type impurity at an inclination angle of about 7° with respect to the surface of said semiconductor substrate, using said gate electrode and said sidewall spacer as masks.

12. A method of fabricating a semiconductor device comprising the steps of:
preparing a semiconductor substrate having a first conductivity type well region and a second conductivity type well region being isolated by an isolation film;
forming gate electrodes on respective surfaces of said first conductivity type well region and said second conductivity type well region with a gate insulating film therebetween;
forming a low-concentration first conductivity type impurity layer by covering only said first conductivity type well region with a mask and obliquely implanting a first conductivity type impurity from a direction forming a prescribed angle with respect to the surface of said semiconductor substrate with said semiconductor substrate being rotated in a plane parallel to its main surface, using said gate electrode as a mask;
forming a low-concentration second conductivity type impurity layer by covering only said second conductivity type well region with a mask and obliquely implanting a second conductivity type impurity from a direction forming a prescribed angle with respect to the surface of said semiconductor substrate with said semiconductor substrate being rotated in a plane parallel to its main surface, using said gate electrode as a mask;
simultaneously forming sidewall spacers on respective sidewalls of said gate electrodes;
forming a high-concentration first conductivity type impurity layer by covering only said first conductivity type well region with a mask and implanting a first conductivity type impurity from a direction substantially perpendicularly to the surface of said semiconductor substrate;
forming a high-concentration second conductivity type impurity layer by covering only said second conductivity type well region with a mask and implanting a second conductivity type impurity from a direction substantially perpendicularly to the surface of said semiconductor substrate.

13. A method of fabricating a semiconductor device comprising the steps of:
preparing a semiconductor substrate having a p-type well region and an n-type well region being isolated by an isolation film;
forming gate electrodes on respective surfaces of said p-type well region and said n-type well region with a gate insulating film therebetween;
forming a low-concentration n-type impurity layer by covering only said n-type well region with a mask and obliquely implanting an n-type impurity from a direction forming a prescribed angle with respect to the surface of said semiconductor substrate, using said gate electrode as a mask;
forming a low-concentration p-type impurity layer by covering only said p-type well region with a mask and obliquely implanting a p-type impurity from a direction forming a prescribed angle with respect to the surface of said semiconductor substrate, using said gate electrode as a mask;
simultaneously forming sidewall spacers on respective sidewalls of said gate electrodes;
forming a medium-concentration n-type impurity layer by covering only said n-type well region with a mask and obliquely implanting an n-type impurity from a direction forming a prescribed inclination angle with respect to the surface of said semiconductor substrate, using said gate electrode and said sidewall spacer as masks;
forming a high-concentration n-type impurity layer by switching said direction of implantation to that substantially perpendicular to the surface of said semiconductor substrate and further switching said dose for implanting an n-type impurity, while continuously covering only said n-type well region with said mask;
forming a medium-concentration p-type impurity layer by covering only said p-type well region with a mask and obliquely implanting a p-type impurity from a direction forming a prescribed inclination angle with respect to the surface of said semiconductor substrate, using said gate electrode and said sidewall spacer as masks; and
forming a high-concentration p-type impurity layer by switching said direction of implantation to that substantially perpendicular to the surface of said semiconductor substrate and further switching said dose for implanting a p-type impurity, while continuously covering only said p-type well region with said mask.

14. A method of fabricating a semiconductor device comprising the steps of;
forming a gate electrode on a first semiconductor substrate having a major surface with a gate insulating film therebetween;
forming sidewall spacers on sidewalls of said gate electrode;
forming a low-concentration impurity layer by obliquely implanting a second conductivity type impurity at a prescribed inclination angle with respect to the surface of said semiconductor substrate using said gate electrode and said sidewall spacer as masks; and forming a high-concentration impurity layer by substantially perpendicularly implanting a second conductivity type impurity with respect to the surface of said semiconductor substrate, using said gate electrode and said sidewall spacer as masks, wherein said low-concentration impurity layer is formed to overlap the gate electrode.

15. A method of fabricating a semiconductor device in accordance with claim 14, wherein an angle formed by the direction of impurity implantation and the surface of said semiconductor substrate is at least 20° and not more than 60° in each of said steps of forming said low-concentration impurity layer.

16. A method of fabricating a semiconductor device in accordance with claim 14, wherein the direction of impurity implantation in the step of fabricating said high-concentration impurity layer is inclined from a normal direction of the surface of said semiconductor substrate by an angle of about 7°, which is the minimum inclination angle for preventing channeling.

17. A mehtod of fabricating a semiconductor device in accordance with claim 14, wherein said first conductivity type is a p type and said second conductivity type is an n type, while dose of said n-type impurities in said steps of forming said low-concentration impurity layer and said high-concentration impurity layer are about $10^{13}/cm^2$ and about $10^{15}/cm^2$ respectively.

18. A method of fabricating a semiconductor device in accordance with claim 14, wherein said semiconductor substrate is rotated in a plane which is parallel to its surface, for implanting said impurities in said steps of forming said low-concentration impurity layer.

19. An improved method of fabricating a semiconductor device, having a triple diffusion impurity layer, on a semiconductor substrate of a first conductivity type and having a major surface, comprising the steps of:

forming a gate insulating film on said substrate, and forming a gate electrode on said insulating film;

forming a sidewall spacer on a sidewall of said gate electrode; and forming in the major surface of said substrate low-concentration, medium-concentration and high-concentration impurity layers, wherein said low-concentration impurity layer is beneath, and approximately aligned with, said gate electrode and said medium-concentration impurity layer is beneath, and approximately aligned with opposite sides of, said sidewall spacer;

wherein at least one of said low-concentration, medium-concentration and high-concentration impurity layers is formed in the preceding step by oblique impurity implantation.

20. An improved method of fabricating a semiconductor device, having a multiple diffusion impurity layer, on a semiconductor substrate of a first conductivity type and having a major surface, comprising the steps of:

forming a gate insulating film on said substrate, and forming a gate electrode on said insulating film, forming a sidewall spacer on a sidewall of said gate electrode; and thereafter forming in the major surface of said substrate low-concentration and high-concentration impurity layers, said low-concentration impurity layer being located beneath said gate electrode and approximately aligned with said sidewall spacer, and said high-concentration impurity layer being aligned approximately with a side of said sidewall spacer;

wherein one of said impurity layers is formed in the preceding step by oblique impurity implantation.

* * * * *